(12) United States Patent
Kim et al.

(10) Patent No.: US 7,154,312 B2
(45) Date of Patent: Dec. 26, 2006

(54) APPARATUS FOR GENERATING INTERNAL CLOCK SIGNAL

(75) Inventors: Nam-Seog Kim, Seoul (KR); Yong-Jin Yoon, Seoul (KR); Uk-Rae Cho, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 45 days.

(21) Appl. No.: 11/031,129

(22) Filed: Jan. 7, 2005

(65) Prior Publication Data

US 2005/0146365 A1 Jul. 7, 2005

(30) Foreign Application Priority Data

Jan. 7, 2004 (KR) .............. 10-2004-0000860

(51) Int. Cl.
*H03L 7/00* (2006.01)

(52) U.S. Cl. .............. 327/161; 327/158; 327/299

(58) Field of Classification Search .............. None
See application file for complete search history.

(56) References Cited

U.S. PATENT DOCUMENTS 5,180,992 A * 1/1993 Akiyama et al. .......... 331/11
5,959,474 A * 9/1999 Park et al. .............. 327/112
6,111,450 A * 8/2000 Powell et al. ............ 327/333
6,201,432 B1 * 3/2001 Lim et al. ............... 327/525
2001/0020859 A1 9/2001 Saeki .................... 327/271
2002/0000851 A1 1/2002 Miyazaki et al. ........ 327/141

* cited by examiner

*Primary Examiner*—Timothy P. Callahan
*Assistant Examiner*—An T. Luu
(74) *Attorney, Agent, or Firm*—F. Chau & Assoc., LLC

(57) ABSTRACT

An apparatus for generating an internal clock signal for acquisition of accurate synchronization is provided. The apparatus including: an input buffer for buffering the external clock signal to output a first reference clock signal; a delay compensation circuit for delaying the first reference clock signal; a forward delay array; a mirror control circuit comprising a plurality of phase detectors for detecting delayed clock signals synchronized with a second reference clock signal; a backward delay array; and an output buffer to generate an internal clock signal. An internal clock signal in accurate synchronization with the reference clock signal can be generated by minimizing the delay and distortion of the reference clock signal.

11 Claims, 7 Drawing Sheets

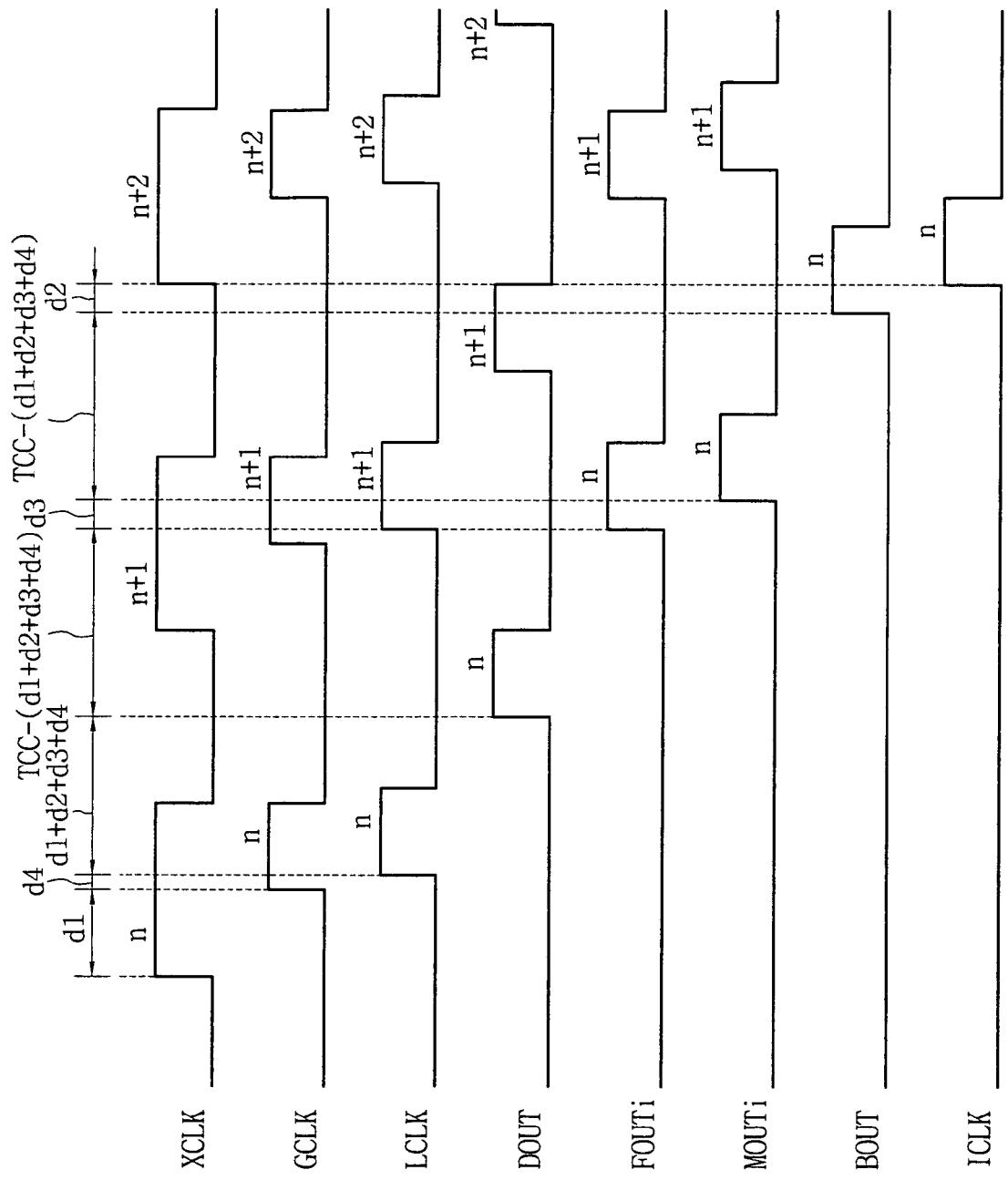

APPARATUS FOR GENERATING INTERNAL CLOCK SIGNAL

BACKGROUND OF THE INVENTION

1. Technical Field

This invention relates to an apparatus for generating an internal clock signal for a synchronous semiconductor memory device (e.g., Synchronous DRAM), and, more particularly, an apparatus for generating an internal clock signal synchronized with an externally applied system clock signal.

2. Discussion of the Related Art

Generally, a synchronous semiconductor memory device generates an internal clock signal in response to a system clock. An internal clock signal is a reference signal for controlling all the operations to write/read data in/from a selected memory device. To generate the internal clock signal, the synchronous semiconductor memory device employs a clock buffer that responds to an externally applied system clock signal. By using such a clock buffer, the system clock signal do no have the same phase difference as the internal clock signal. Therefore, with the system clock signal applied to the memory chip, the internal operation of the chip is delayed by such phase difference.

Methods for eliminating the phase difference include clock recovery by use of a phase locked loop or a delay locked loop. However, a certain amount of time is needed for generating the internal clock using a phase locked loop or a delay locked loop, thereby increasing the total standby current even when the device is not in operation (i.e., the device is in stand-by mode).

Another approach to reducing a clock skew and generating an internal clock signal completely synchronized with an external system clock signal is using a voltage-controlled delay line. A voltage-controlled delay line can be a synchronous delay line (SDL) circuit, or a synchronous mirror delay (SMD) circuit.

FIG. 1 is a schematic block diagram of a conventional SMD circuit, and FIG. 2 is a detailed block diagram of a delay group 50 of the SMD circuit of FIG. 1.

The SMD circuit shown in FIG. 1 includes an input buffer IBUF, a delay compensation circuit DCC, a forward delay array FDA 10, a mirror control circuit MCC 20, a backward delay array BDA 30, and an output buffer INTBUF. A delay group 50 includes the FDA 10, the mirror control circuit MCC 20, and the backward delay array BDA 30. FIG. 2 shows a detailed block diagram of the delay group 50 of FIG. 1, including a plurality of serially-connected delay units FD 1 to FDn of the forward delay array FDA 10, a plurality of phase detectors PD1 to PDn of the mirror control circuit MCC 20, a plurality of serially-connected delay units BD1 to BDn of the backward delay array BDA 30, and dummy loads DL1 to DLn 40.

Referring now to FIGS. 1 and 2, the input buffer IBUF receives an external clock signal XCLK and generates a reference clock signal PCLK.

The delay compensation circuit DCC delays the reference clock signal PCLK from the input buffer IBUF by a predetermined time 'd1'.

The forward delay array 10 includes a plurality of serially-connected delay units FD1 to FDn and generates a plurality of delayed clock signals FOUTi, where i=1-n. The delay units FD1 to FDn of the forward delay array 10 are under the control of the mirror control circuit 20. Each of the delay units FD1 to FDn is set to have a same delay time 'TCC−(d1+d2+d3)'.

The mirror control circuit 20 includes a plurality of phase detectors PD1 to PDn, each of which receives a reference clock signal from the input buffer and the delayed clock signal FOUTi from the corresponding delay unit FDi in the forward delay array 10. Each phase detector PDi detects whether the reference clock signal PCLK has the same phase as the delayed clock signal FOUTi. Namely, the mirror control circuit 20 detects a delayed clock signal FOUTi having a phase difference of one cycle 'TCC' with respect to the reference clock signal from the input buffer IBUF. Here, the delayed clock signal FOUTi is delayed by the delay time 'd3' of the mirror control circuit 20 into a delayed clock signal MOUTi.

The backward delay array 30 includes a plurality of serially-connected delay units BD1 to BDn. The respective delay units BDi are constructed to have the same delay time 'TCC−(d1+d2+d3)' as the respective delay units of the forward delay array 10.

The output buffer INTBUF delays a clock signal BOUT of the backward delay array 30 by a delay time 'd2' to output an internal clock signal ICLK. The internal clock signal ICLK has the same phase as the external clock signal XCLK.

The dummy load 40 is a load additionally provided so that the forward delay array 10 and the mirror control circuit 20 have a symmetric structure to the backward delay array 30 and the dummy load 40.

Referring to FIG. 3, an operational timing diagram of FIG. 1 is shown. Upon receiving an external clock signal XCLK externally applied, the input buffer IBUF generates a reference clock signal PCLK. The reference clock signal PCLK is delayed by a delay time 'd1' through the input buffer IBUF.

Subsequently, the delay compensation circuit DCC delays the reference clock signal PCLK by a delay time 'd1+d2+d3', which is the sum of the delay time 'd1' of the input buffer IBUF, the delay time 'd2' of the output buffer INTBUF, and the delay time 'd3' of the mirror control circuit 20.

The delayed clock signal DOUT from the delay compensation circuit DCC is fed into the forward delay array 10. The forward delay array 10 delays the delayed clock signal DOUT with the delay units FD1 to FDn in sequence. The delay time of the forward delay array 10 is 'TCC−(d1+d2+d3)', where TCC is the cycle of the external clock signal PCLK.

The mirror control circuit 20 compares the reference clock signal PCLK with a plurality of delayed clock signals FOUTi (i=1−n) and detects a delayed clock signal FOUTi having the same phase as the reference clock signal PCLK. Namely, the mirror control circuit 20 detects a clock signal delayed by one cycle with respect to the reference clock signal PCLK from the input buffer IBUF, i.e., a clock signal FOUTi having a phase difference of one cycle with the reference signal.

The delayed clock signal FOUTi thus detected is output as an internal clock signal ICLK through the backward delay array 30 and the output buffer INTBUF.

The total time required for acquiring synchronization of the internal clock signal ICLK with the external clock signal XCLK is given by the following equation:

$$T=d1+(d1+d2+d3)+(TCC-(d1+d2+d3))+d3+(TCC-(d1+d2+d3))+d2=2TCC$$

In the above equation, 'd1' is the delay time of the input buffer IBUF; 'd1+d2+d3' is the delay time of the delay compensation circuit DCC; 'TCC−(d1+d2+d3)' is the delay time of the forward and backward delay arrays 10 and 30 at the time when the reference clock signal PCLK applied to the mirror control circuit 20 is synchronized with the clock signal passing through the forward delay array 10; and 'd2' is the delay time of the output buffer INTBUF.

As can be seen from the above equation, the internal clock signal ICLK is synchronized with the external clock signal XCLK after two cycles. Namely, the internal clock signal ICLK is in synchronization with the (n+2)-th external clock signal XCLK with respect to the n-th external clock signal, as illustrated in FIG. 3. Consequently, the internal clock signal ICLK synchronized with the external clock signal XCLK is generated two cycles after an input of the external clock signal XCLK.

U.S. Pat. No. 6,643,219 discloses an example of the kind of SMD circuit as shown in FIGS. 1–3 above. In such a conventional SMD circuit, a desired delay cannot be acquired because of a large loading capacitance of the delay unit when a reference clock signal is applied to the mirror control circuit.

FIG. 4 shows a reference clock signal PCLK1 fed into the phase detector of a first unit in the conventional reference clock signal, and a reference clock signal PCLK2 fed into the phase detector of a last unit.

As shown in FIG. 4, there is a difference between the reference clock signal PCLK1 fed into the phase detector of the first unit and the reference clock signal fed into the phase detector of the last unit. The loading capacitance on the clock line causes a distortion or a delay of the reference clock signal by a delay time of 'td'.

This means the difference of the reference clock signals of the synchronous mirror control circuit leads to errors when the internal clock signal is synchronized with the reference clock signal. Namely, the reference clock signal is fed into the respective phase detectors of the mirror control circuit to cause a delay time according to the input load, making it difficult to acquire accurate synchronization.

SUMMARY OF THE INVENTION

There is provided an apparatus for generating an internal clock signal that includes: an input buffer for buffering the external clock signal to output a first reference clock signal; a delay compensation circuit for delaying the first reference clock signal; a forward delay array comprising a plurality of delay units for sequentially delaying the output clock signals output from the delay compensation circuit in a forward direction to output delayed clock signals; a plurality of local clock drivers for applying a second reference clock signal to a predetermined number of phase detectors in response to the first reference clock signal; a mirror control circuit comprising a plurality of phase detectors for detecting delayed clock signals synchronized with the second reference clock signal among the delayed clock signals of the forward delay array; a backward delay array comprising a plurality of delay units for sequentially delaying the delayed clock signals output from the mirror control circuit in a backward direction to output delayed clock signals; and an output buffer for buffering the delayed clock signals of the backward delay array to generate an internal clock signal.

The local clock driver includes two serially-connected inverters. The delay time of the delay compensation circuit is the sum of double the delay time of the local clock driver, the delay time of the input buffer, the delay time of the output buffer, and the delay time of the mirror control circuit. The delay time of the forward delay array and the backward delay array is the sum of the delay time of the local clock driver, the delay time of the input buffer, the delay time of the output buffer, and the delay time of the mirror control circuit minus an integer multiple of the cycle of the first reference clock signal.

In another aspect of the present invention, there is provided an apparatus for generating an internal clock signal that includes: a plurality of phase detectors for, detecting a delayed clock signal synchronized with a reference clock signal among delayed clock signals generated by delaying the external clock signal by a predetermined time; and a plurality of local clock drivers for applying the reference clock signal to a predetermined number of phase detectors, respectively.

The local clock driver includes two serially-connected inverters. The external clock signal has the same cycle as the reference clock signal.

The above construction enables the generation of an internal clock signal in accurate synchronization with an external clock signal.

BRIEF DESCRIPTION OF THE DRAWINGS

FIG. 8 is an operational timing diagram of FIGS. 5 and 6.

DETAILED DESCRIPTION OF THE PREFERRED EMBODIMENTS

Figure 5:
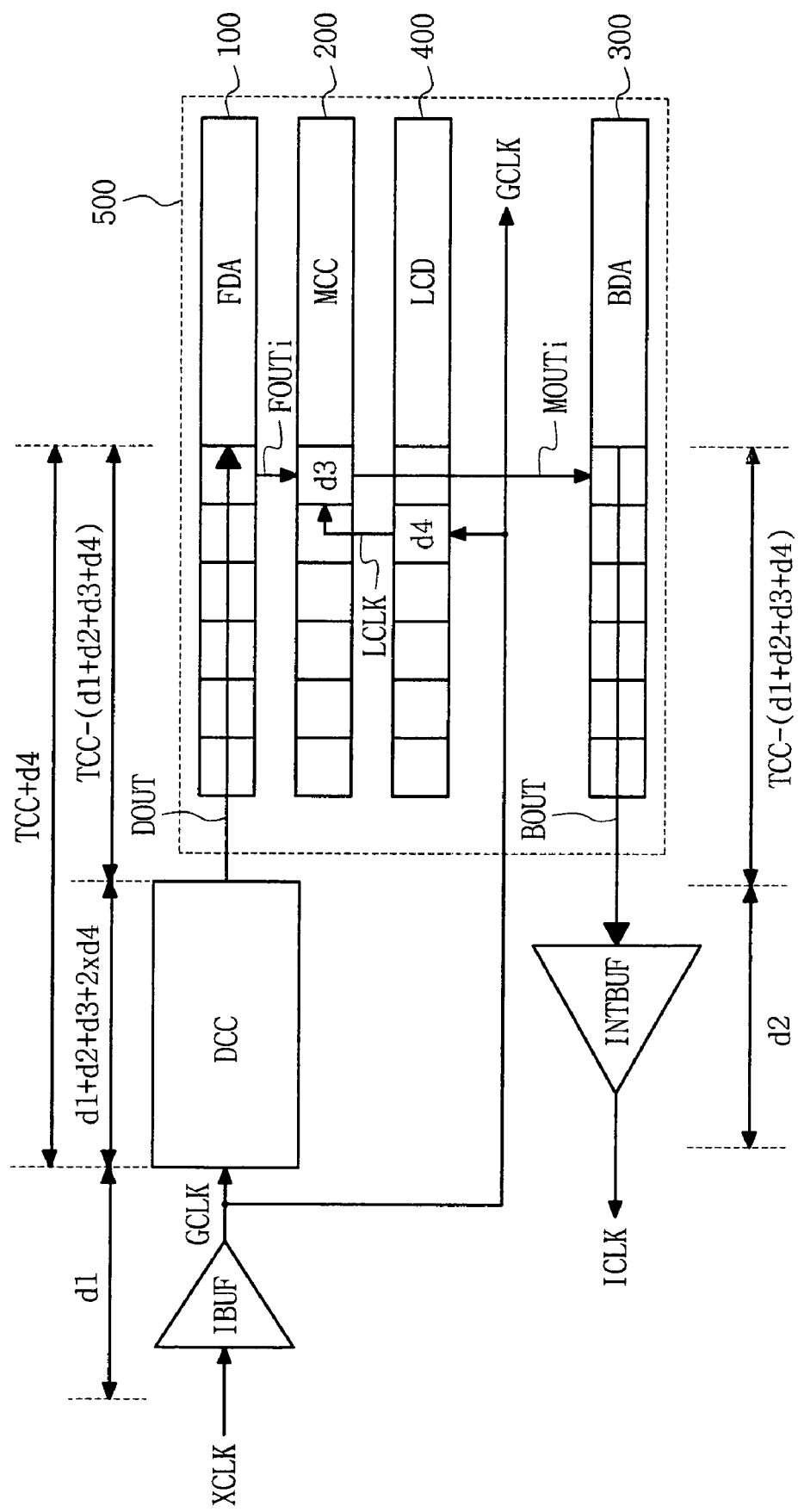
FIG. 5 is a block diagram of an apparatus for generating an internal clock signal according to an exemplary embodiment of the present invention.
Figure 6:
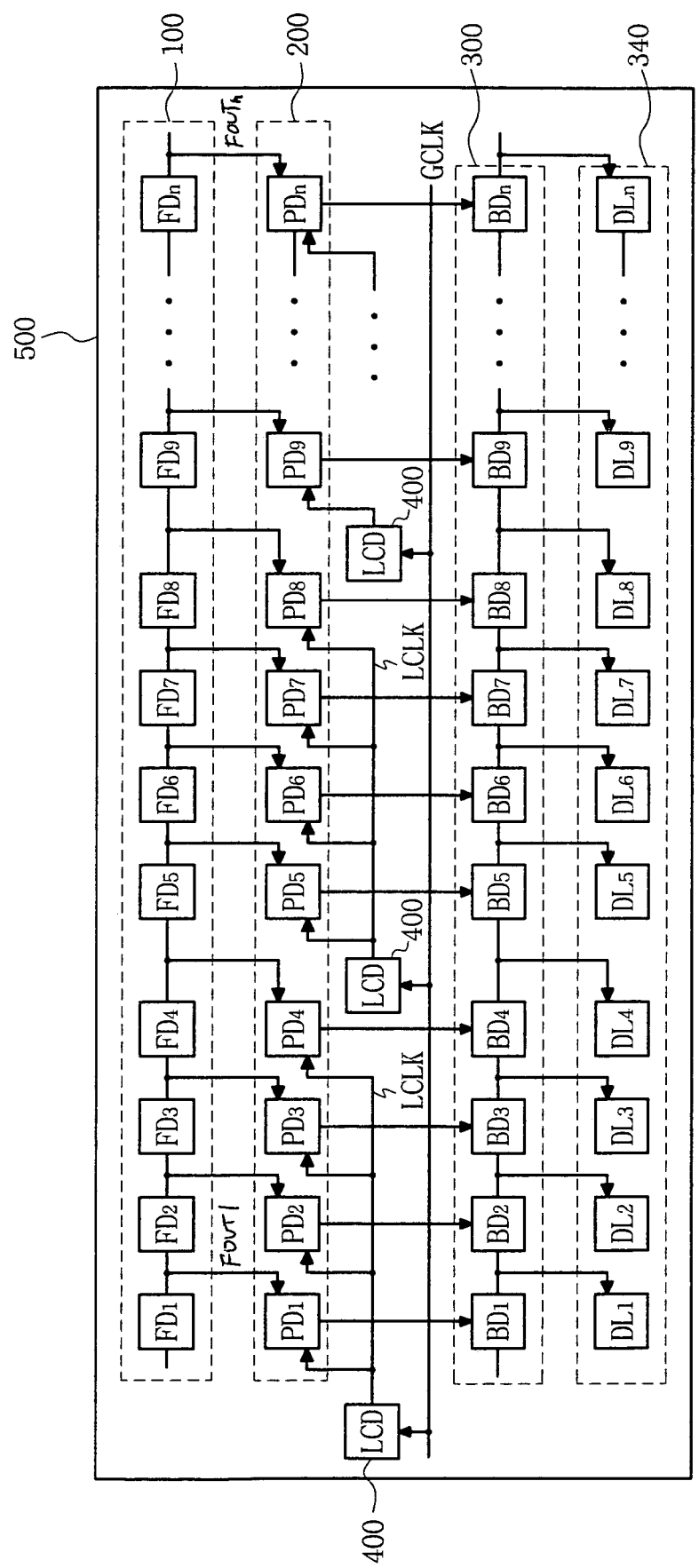
FIG. 6 is a detailed block diagram of the delay group shown in FIG. 5.

FIG. 5 is a block diagram of a SMD circuit according to the present invention, and FIG. 6 is a detailed block diagram of a delay group 500 of the SMD circuit of FIG. 5.

The SMD circuit of FIG. 5 shows an input buffer IBUF, a delay compensation circuit DCC, a forward delay array FDA 100, a mirror control circuit MCC 200, a backward delay array BDA 300, an output buffer INTBUF, and a local clock driver LCD 400. A delay group 500 includes the forward delay array FDA 100, the mirror control circuit MCC 200, the backward delay array BDA 300, and the local clock driver LCD 400. FIG. 6 shows a detailed block diagram of the delay group 500 of FIG. 5, including a plurality of serially-connected delay units FD1 to FDn of the forward delay array FDA 100, a plurality of phase detectors PD1 to PDn of the mirror control circuit MCC 200, a plurality of serially-connected delay units BD1 to BDn of the backward delay array BDA 300, dummy loads DL1 to DLn 340, and the local clock driver LCD 400.

Referring now to FIGS. 5 and 6, the input buffer IBUF receives an external clock signal XCLK and generates a first reference clock signal GCLK. The first reference clock signal GCLK is delayed by a delay time 'd1' through the input buffer IBUF.

The delay compensation circuit DCC delays the first reference clock signal GCLK from the input buffer IBUF by a delay time 'd1+d2+d3+2×d4'.

The forward delay array 100 includes a plurality of serially-connected delay units FD1 to FDn and generates a plurality of delayed clock signals FOUT1 to FOUTn. The delay units FD1 to FDn of the forward delay array 100 are controlled by the mirror control circuit 200. Each of the delay units FD1 to FDn is set to have a same delay time 'TCC−(d1+d2+d3)'.

The mirror control circuit 200 includes a plurality of phase detectors PD1 to PDn, each of which receives a second reference clock signal LCLK from the local clock driver 400 and a delayed clock signal FOUTi (i=1−n) from the corresponding delay unit FDi (i=1−n) in the forward delay array 100. Each of the phase detectors PDi (i=1−n) detects whether the second reference clock signal LCLK and FOUTi have a same phase.

Namely, the mirror control circuit 200 detects a delayed clock signal FOUTi having the same phase difference as the second reference clock signal LCLK from the local clock driver 400.

The local clock driver 400, which is provided to prevent a delay or a distortion of the first reference clock signal GCLK, receives the first reference clock signal GCLK to generate the second reference clock signal LCLK from the first reference clock signal GCLK delayed by a predetermined time. The local clock driver 400 is such that, a predetermined number of phase detectors among the plurality phase detectors PD1 to PDn receive the second reference clock signal LCLK from one local clock driver. Where each local clock driver is used for n phase detectors, for example, the loading capacitance appearing on a metal wire to which the reference clock signal is applied can be reduced depending on the number of installed local clock drivers. As shown in FIG. 6, each local clock driver 400 is installed for 4 phase detectors to generate the second reference clock signal LCLK to the mirror control circuit 200. Therefore, the loading capacitance is much reduced to prevent a delay and a distortion of the reference clock signal.

The backward delay array 300 includes a plurality of serially-connected delay units BD1 to BDn. The respective delay units BDi are constructed to have the same delay time as the respective delay units FD1 to FDn of the forward delay array 100.

The dummy load 340 is a load additionally provided so that the forward delay array 100 and the mirror control circuit 200 have a symmetric structure to the backward delay array 300 and the dummy loads 340.

The output buffer INTBUF delays a clock signal BOUT of the backward delay array 300 by a delay time 'd2' to output an internal clock signal ICLK in phase synchronization with the external clock signal XCLK.

Figure 1:
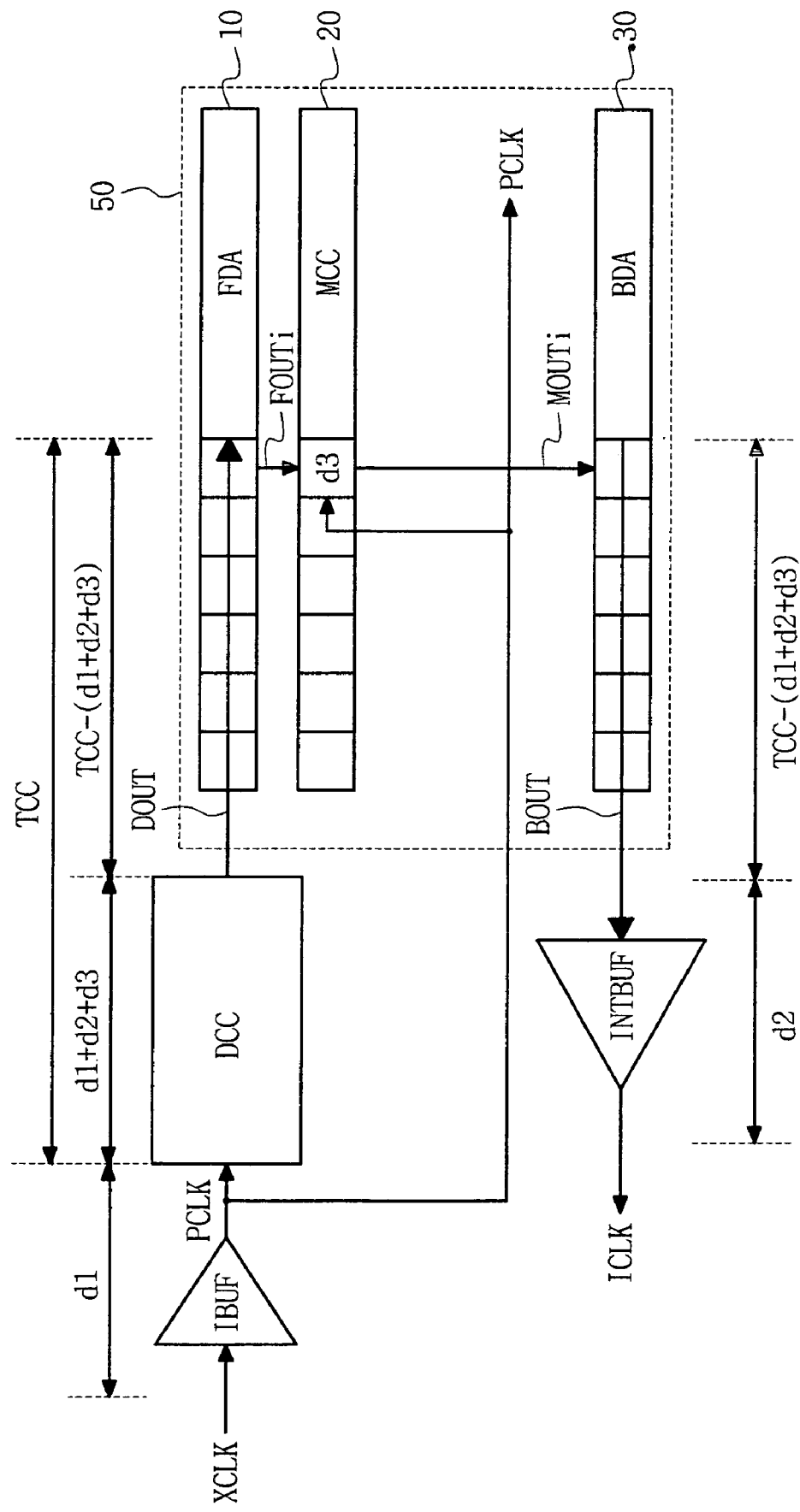
FIG. 1 is a block diagram of a conventional apparatus for generating an internal clock signal.
Figure 2:
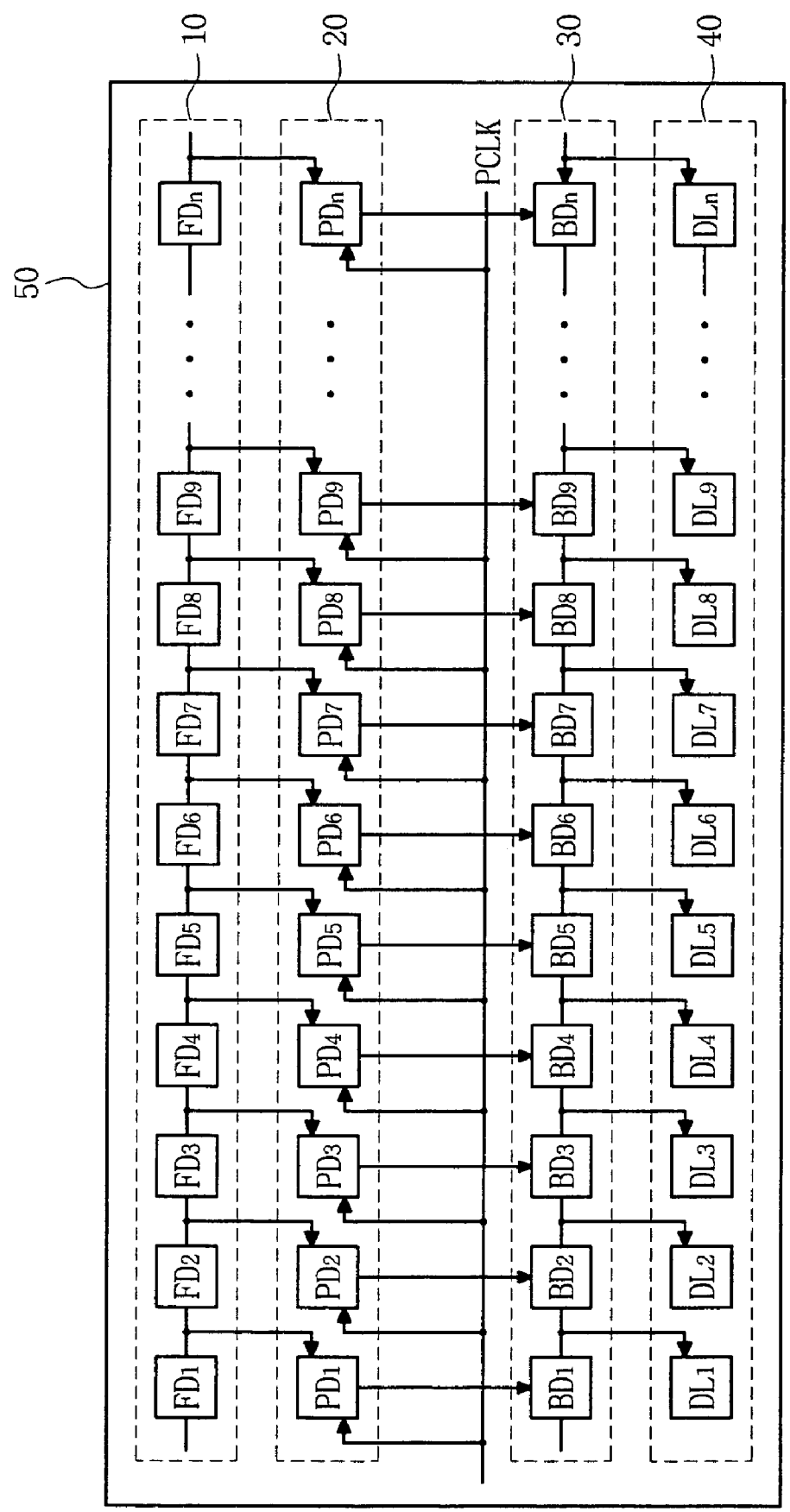
FIG. 2 is a detailed block diagram of the characteristic sections of FIG. 1.
Figure 3:
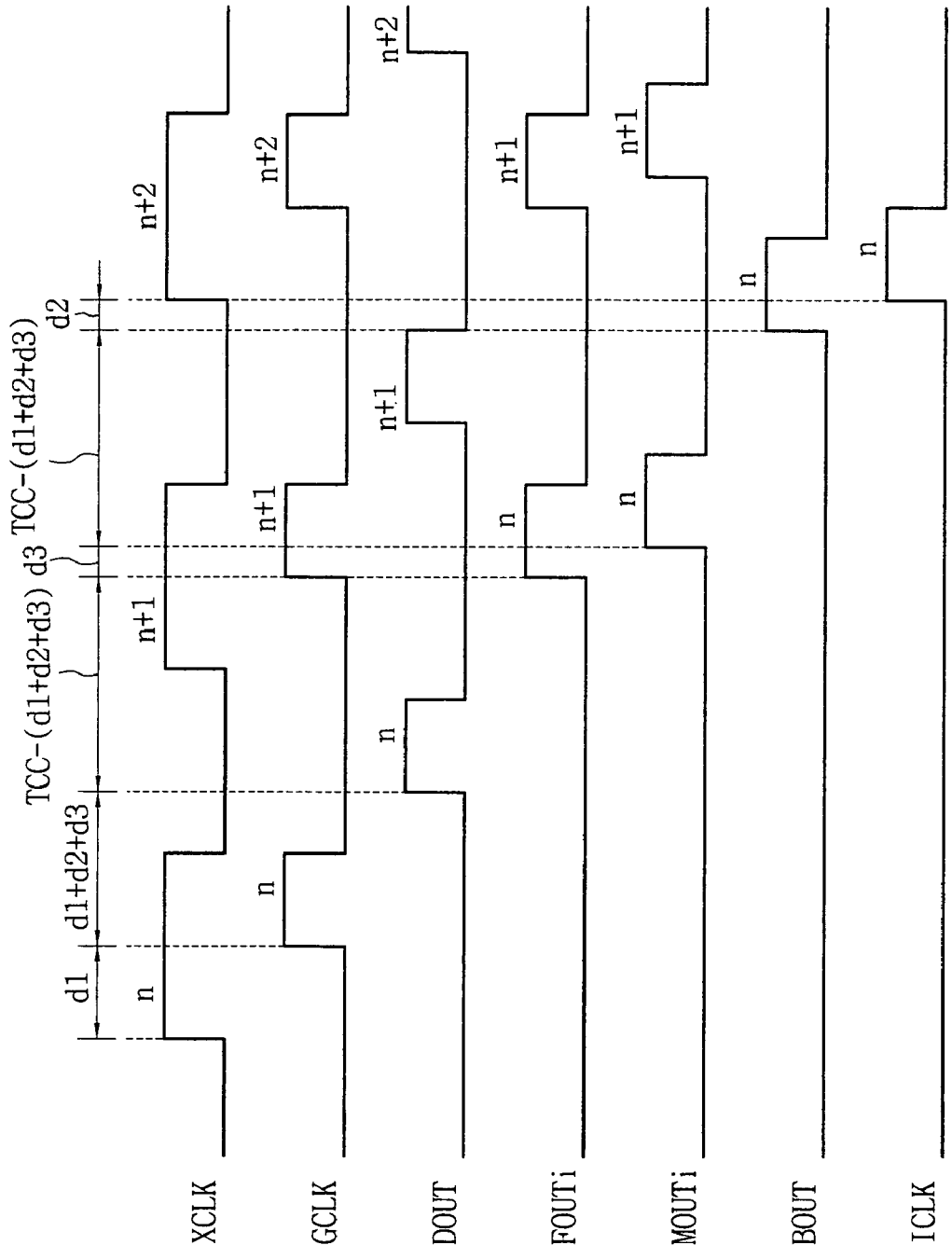
FIG. 3 is an operational timing diagram of FIGS. 1 and 2.
Figure 4:
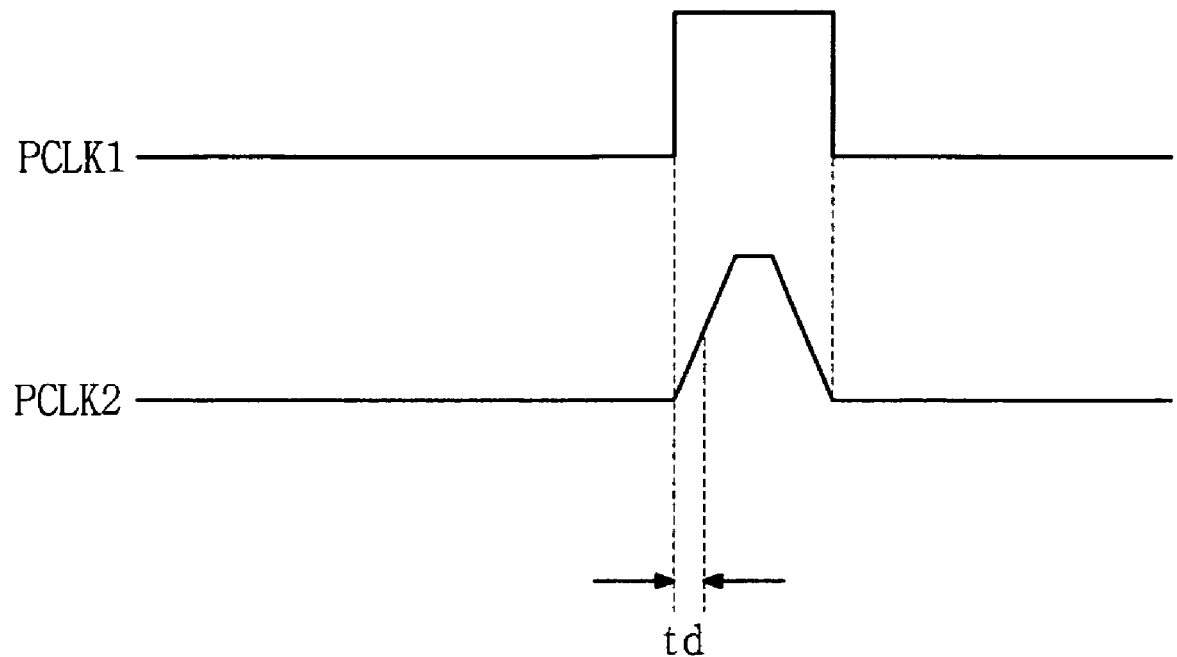
FIG. 4 is a timing diagram showing the delay and distortion of a reference clock signal.
Figure 7:
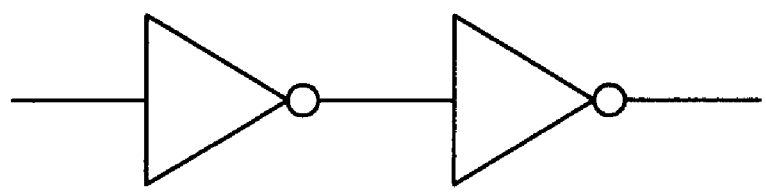
FIG. 7 is a circuit diagram of a local clock driver according to an exemplary embodiment of the present invention.

FIG. 7 is a circuit diagram of a local clock driver according to an exemplary embodiment of the present invention. The local clock driver comprises two serially-connected inverters, as shown in FIG. 7, and minimizes or prevents a delay or a distortion of the first reference clock signal GCLK. The delay time of the local clock driver is set to 'd4'.

FIG. 8 is an operational timing diagram of a SMD circuit according to an exemplary embodiment of the present invention.

Hereinafter, reference will be made to FIGS. 5 to 8 to describe the operation of an exemplary SMD circuit.

Referring to FIGS. 5 to 8, upon receiving an external clock signal XCLK externally applied, the input buffer IBUF generates a first reference clock signal GCLK. The first reference clock signal GCLK is delayed by a delay time 'd1' through the input buffer IBUF.

Subsequently, the delay compensation circuit DCC delays the first reference clock signal GCLK by a delay time 'd1+d2+d3+2×d4', which is the sum of the delay time 'd1' of the input buffer IBUF, the delay time 'd2' of the output buffer INTBUF, the delay time 'd3' of the mirror control circuit 200, and double the delay time 'd4' of the local clock driver 400.

The delayed clock signal DOUT from the delay compensation circuit DCC is fed into the forward delay array 100. The forward delay array 100 delays the delayed clock signal FOUTi with the delay units FD1 to FDn in sequence. The delay time of the forward delay array 100 is 'TCC−(d1+d2+d3+4)', where 'TCC' is the cycle of the external clock signal XCLK.

The local clock driver 400 delays the first reference clock signal GCLK by a delay time 'd4' to generate a second reference clock signal LCLK.

The mirror control circuit 200 compares the second reference clock signal LCLK with a plurality of delayed clock signals FOUTi (i=1−n) and detects a delayed clock signal FOUTi having the same phase as the second reference clock signal LCLK. Namely, the mirror control circuit 200 detects a delayed clock signal having a delay time that is the sum of one cycle 'TCC' of the first reference clock signal GCLK from the input buffer IBUF and the delay time 'd4' of the local clock driver. That is, the delayed clock signal FOUTi having a phase difference of one cycle with the second reference clock signal LCLK. The delayed clock signal FOUTi thus detected is applied to the backward delay array 300.

The backward delay array 300 delays the delayed clock signal FOUTi detected by the mirror control circuit 200 by the delay time 'TCC−(d1+d2+d3+4)' of the forward delay array 100.

The output buffer INTBUF outputs the delayed clock signal of the backward delay array 300 with a delay time 'd2' as an internal clock signal ICLK.

The total time required for acquiring synchronization of the internal clock signal ICLK with the external clock signal XCLK is given by the following equation:

$$T=d1+(d1+d2+d3+2\times d4)+2(TCC-(d1+d2+d3+d4))+d3+d2=2TCC$$

In the above equation, 'd1' is the delay time of the input buffer IBUF; 'd1+d2+d3+2×d4' is the delay time of the delay compensation circuit DCC; 'TCC−(d1+d2+d3+d4)' is the delay time of the forward and backward delay arrays 10 and 30 at the time when the second reference clock signal LCLK applied to the mirror control circuit 200 is synchronized with the clock signal passing through the forward delay array 100; 'd3' is the delay time of the mirror control circuit 200; and 'd4' is the delay time of the local clock driver 400.

As can be seen from the above equation, the internal clock signal ICLK is synchronized with the external clock signal XCLK after two cycles. Namely, the internal clock signal ICLK is synchronized with the (n+2)-th external clock signal XCLK with respect to the n-th external clock signal XCLK, as illustrated in FIG. 8. Consequently, the internal clock signal ICLK synchronized with the external clock signal XCLK is generated two cycles after an input of the external clock signal XCLK.

As described above, according to the present invention, the reference clock signal is applied to a predetermined number of delay units with a local clock driver, so a distortion or a delay of the reference clock signal can be minimized or prevented. In addition, the minimization or prevention of a distortion or a delay of the reference clock signal enables generation of an internal clock signal accurately synchronized with an external clock signal.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims. In a different case, for example, it is possible to change the internal construction of a circuit or to replace the internal component elements of the circuit with another equivalent elements.

What is claimed is:

1. An apparatus for generating an internal clock signal synchronized with an external clock signal, the apparatus comprising:
   an input buffer for buffering the external clock signal to output a first reference clock signal;
   a delay compensation circuit for delaying the first reference clock signal by a predetermined time to output a delayed first reference clock signal;
   a forward delay array comprising a plurality of first delay units for sequentially delaying the delayed first reference clock signal output from the delay compensation circuit in a forward direction to output first delayed clock signals;
   a mirror control circuit including a plurality of phase detectors;
   a plurality of local clock drivers, less in number than the plurality of phase detectors, receiving the first reference clock signal and each producing therefrom a second reference clock signal,
   wherein the plurality of phase detectors respectively receive the first delayed clock signals from the plurality of first delay units, wherein the plurality of phase detectors are arranged in groups and the phase detectors in each group each receive the second reference clock signal from one of the plurality of local clock drivers, and wherein the mirror control circuit determines second delayed clock signals comprising the first delayed clock signals that are in phase with the second reference clock signal;
   a backward delay array comprising a plurality of second delay units for sequentially delaying the second delayed clock signals output from the mirror control circuit in a backward direction to output third delayed clock signals; and
   an output buffer for buffering the third delayed clock signals of the backward delay array to generate the internal clock signal.

2. The apparatus as claimed in claim 1, wherein each of the plurality of local clock drivers comprises two serially-connected inverters.

3. The apparatus as claimed in claim 2, wherein a delay time of the delay compensation circuit is the sum of double a delay time of one of the plurality of local clock drivers, a delay time of the input buffer, a delay time of the output buffer, and a delay time of the mirror control circuit.

4. The apparatus as claimed in claim 3, wherein respective delay times of the plurality of first delay units of the forward delay array are equal to the respective delay times of the plurality of second delay units of the backward delay array.

5. The apparatus as claimed in claim 4, wherein a delay time of the forward delay array and the backward delay array is the sum of the delay time of one of the plurality of local clock drivers, the delay time of the input buffer, the delay time of the output buffer, and the delay time of the mirror control circuit minus an integer multiple of a cycle of the first reference clock signal.

6. The apparatus as claimed in claim 5, wherein the first reference clock signal has the same cycle as the second reference clock signal.

7. The apparatus as claimed in claim 6, wherein a delay time of the first delayed clock signals of the forward delay array is the sum of an integer multiple of the cycle of the first reference clock signal and the delay time of one of the plurality of local clock drivers.

8. An apparatus for generating an internal clock signal synchronized with an external clock signal, the apparatus comprising:
   a plurality of phase detectors for detecting a delayed clock signal in phase with a reference clock signal, wherein the plurality of phase detectors are divided into groups and each group receives the same reference clock signal, and wherein the delayed clock signal is generated by delaying the external clock signal by a predetermined time; and
   a plurality of local clock drivers less in number than the plurality of phase detectors for producing the reference clock signals from the external clock signal and supplying the reference clock signal to the groups of phase detectors, respectively.

9. The apparatus as claimed in claim 8, wherein each of the plurality of local clock drivers comprises two serially-connected inverters.

10. The apparatus as claimed in claim 9, wherein the external clock signal has the same cycle as the reference clock signal.

11. A method for generating an internal clock signal synchronized with an external clock signal, the method comprising the steps of:
    buffering the external clock signal to output a first reference clock signal;
    delaying the first reference clock signal to output a delayed first reference clock signal;
    sequentially delaying the delayed first reference clock signals in a forward direction to output first delayed clock signals;
    producing second reference clock signals less in number than the first delayed clock signals from the first reference clock signal;
    applying the second reference clock signals and the first delayed clock signals to a number of phase detectors in for detecting an in-phase condition therebetween and producing second delayed clock signals;
    sequentially delaying the second delayed clock signals in a backward direction to output a third delayed clock signal; and
    buffering the third delayed clock signal to generate the internal clock signal.

* * * * *